(12) United States Patent
Ramakrishnan et al.

(10) Patent No.: US 8,383,455 B2
(45) Date of Patent: Feb. 26, 2013

(54) ELECTRONIC DEVICE INCLUDING AN ORGANIC ACTIVE LAYER AND PROCESS FOR FORMING THE ELECTRONIC DEVICE

(75) Inventors: Ed Sundaram Ramakrishnan, Spring, TX (US); Shiva Prakash, Santa Barbara, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/423,797

(22) Filed: Mar. 19, 2012

(65) Prior Publication Data

US 2012/0178208 A1 Jul. 12, 2012

Related U.S. Application Data

(62) Division of application No. 11/642,158, filed on Dec. 20, 2006, now Pat. No. 8,173,995.

(60) Provisional application No. 60/753,516, filed on Dec. 23, 2005.

(51) Int. Cl.
*H01L 51/40* (2006.01)
(52) U.S. Cl. ............ 438/99; 257/40; 257/E51.001
(58) Field of Classification Search ............ 257/40; 438/99
See application file for complete search history.

(56) References Cited

U.S. PATENT DOCUMENTS

| | | | |
|---|---|---|---|
| 1,626,682 A | 5/1927 | Macrae | |
| 1,655,248 A | 1/1928 | Sharp | |
| 2,295,694 A | 9/1942 | Frederick | |
| 3,338,034 A | 8/1967 | Hemstreet | |
| 3,489,608 A | 1/1970 | Jacobs et al. | |
| 3,896,042 A | 7/1975 | Anderson et al. | |
| 4,244,722 A | 1/1981 | Tsuya | |
| 4,322,394 A | 3/1982 | Mezey et al. | |
| 4,421,589 A | 12/1983 | Armini et al. | |
| 4,424,144 A | 1/1984 | Pryor et al. | |
| 4,481,018 A | 11/1984 | Coe et al. | |
| 4,544,378 A | 10/1985 | Coe et al. | |
| 4,573,627 A | 3/1986 | Miller et al. | |
| 4,698,233 A | 10/1987 | Ohira et al. | |
| 4,718,974 A | 1/1988 | Minaee | |
| 4,768,081 A | 8/1988 | Moeller et al. | |

(Continued)

FOREIGN PATENT DOCUMENTS

| | | |
|---|---|---|
| CN | 1132113 A | 10/1996 |
| CN | 1333560 A | 1/2002 |

(Continued)

OTHER PUBLICATIONS

Campbell, I.H. et al., "Excitation Transfer Processes in a Phosphor-Doped Poly 9p-phenylene vinylene) Light-Emitting Diode," Physical Review B., vol. 65, 085210-1-085210-8.

(Continued)

*Primary Examiner* — Anthony Ho

(57) ABSTRACT

An electronic device can include an organic active layer and an electrode. In one aspect, the electrode can further include a first layer that is conductive, and a second layer that is conductive. The second layer can include a defect extending at least partly through a thickness of the second conductive layer. The electrode can also include a third layer lying within and substantially filling the defect, wherein each of the second and third layers includes a same metallic element.

In another aspect, a process for forming an electronic device can include forming an organic active layer and forming a first layer that is conductive and is part of an electrode. The process can also include forming a second layer and exposing the second layer to a first plasma to form a first compound from the second layer.

14 Claims, 3 Drawing Sheets

U.S. PATENT DOCUMENTS

| | | |
|---|---|---|
| 4,899,921 A | 2/1990 | Bendat et al. |
| 4,909,862 A | 3/1990 | Tachikawa et al. |
| 5,051,654 A | 9/1991 | Nativi et al. |
| 5,094,709 A | 3/1992 | Eichelberger et al. |
| 5,152,813 A | 10/1992 | Coe et al. |
| 5,191,218 A | 3/1993 | Mori et al. |
| 5,244,707 A | 9/1993 | Shores et al. |
| 5,258,058 A | 11/1993 | Coe et al. |
| 5,275,715 A | 1/1994 | Tuttle |
| 5,286,676 A | 2/1994 | Kruger et al. |
| 5,352,327 A | 10/1994 | Witowski |
| 5,354,360 A | 10/1994 | Coe et al. |
| 5,401,536 A | 3/1995 | Shores et al. |
| 5,401,706 A | 3/1995 | Fischer |
| 5,417,957 A | 5/1995 | Coe et al. |
| 5,419,891 A | 5/1995 | Coe et al. |
| 5,434,472 A | 7/1995 | van den Boom |
| 5,443,663 A | 8/1995 | Meletis |
| 5,460,796 A | 10/1995 | Verduijn et al. |
| 5,498,925 A | 3/1996 | Bell et al. |
| 5,591,379 A | 1/1997 | Shores |
| 5,612,256 A | 3/1997 | Stansbury et al. |
| 5,656,860 A | 8/1997 | Lee et al. |
| 5,696,785 A | 12/1997 | Bartholomew et al. |
| 5,763,998 A | 6/1998 | Colombo et al. |
| 5,788,551 A | 8/1998 | Dynka et al. |
| 5,801,487 A | 9/1998 | Shinohara et al. |
| 5,882,761 A | 3/1999 | Kawami et al. |
| 5,912,422 A | 6/1999 | Bomard et al. |
| 5,920,080 A | 7/1999 | Jones |
| 5,931,713 A | 8/1999 | Watkins et al. |
| 5,936,342 A | 8/1999 | Ono et al. |
| 5,945,780 A | 8/1999 | Ingle et al. |
| 5,962,962 A | 10/1999 | Fujita et al. |
| 5,964,630 A | 10/1999 | Slusarczuk et al. |
| 6,004,477 A | 12/1999 | Nakagawa et al. |
| 6,033,278 A | 3/2000 | Watkins et al. |
| 6,054,808 A | 4/2000 | Watkins et al. |
| 6,069,443 A | 5/2000 | Jones et al. |
| 6,081,071 A | 6/2000 | Rogers |
| 6,113,450 A | 9/2000 | Narayanan et al. |
| 6,124,027 A | 9/2000 | Ries et al. |
| 6,139,922 A | 10/2000 | Kaloyeros et al. |
| 6,168,490 B1 | 1/2001 | Hozer et al. |
| 6,209,480 B1 | 4/2001 | Moslehi |
| 6,226,890 B1 | 5/2001 | Boroson et al. |
| 6,232,150 B1 | 5/2001 | Lin et al. |
| 6,255,239 B1 | 7/2001 | Sakoske |
| 6,259,204 B1 | 7/2001 | Ebisawa et al. |
| 6,274,207 B1 | 8/2001 | Balkus, Jr. et al. |
| 6,303,238 B1 | 10/2001 | Thompson et al. |
| 6,304,311 B1 | 10/2001 | Egami et al. |
| 6,333,460 B1 | 12/2001 | Toy et al. |
| 6,350,429 B1 | 2/2002 | Murrell et al. |
| 6,422,824 B1 | 7/2002 | Lee et al. |
| 6,440,230 B1 | 8/2002 | Klein |
| 6,465,953 B1 | 10/2002 | Duggal |
| 6,472,819 B2 | 10/2002 | Carretti et al. |
| 6,477,222 B1 | 11/2002 | Nystrom et al. |
| 6,489,718 B1 | 12/2002 | Schmid et al. |
| 6,495,233 B1 | 12/2002 | Shmurun et al. |
| 6,528,939 B1 | 3/2003 | Kawase |
| 6,548,040 B1 | 4/2003 | Rouleau et al. |
| 6,554,672 B2 | 4/2003 | Dunham et al. |
| 6,559,596 B1 | 5/2003 | Arai et al. |
| 6,576,351 B2 | 6/2003 | Silvernail |
| 6,583,549 B2 | 6/2003 | Takenaka et al. |
| 6,585,837 B1 | 7/2003 | Keil et al. |
| 6,586,087 B2 | 7/2003 | Young |
| 6,589,414 B2 | 7/2003 | Klein |
| 6,590,157 B2 | 7/2003 | Boroson et al. |
| 6,590,254 B2 | 7/2003 | Tanaka |
| 6,608,283 B2 | 8/2003 | Liu et al. |
| 6,673,400 B1 | 1/2004 | Bedinger et al. |
| 6,737,176 B1 | 5/2004 | Otsuki et al. |
| 6,762,547 B2 | 7/2004 | Arai et al. |
| 6,822,293 B2 | 11/2004 | Yamazaki et al. |
| 6,878,657 B2 | 4/2005 | Jasra et al. |
| 6,888,307 B2 | 5/2005 | Silvernail |
| 6,891,326 B2 | 5/2005 | Lu |
| 6,936,131 B2 | 8/2005 | McCormick et al. |
| 6,958,490 B2 | 10/2005 | Okamoto et al. |
| 6,998,648 B2 | 2/2006 | Silvernail |
| 7,438,829 B2 | 10/2008 | Cho et al. |
| 7,504,655 B2 | 3/2009 | Parker |
| 7,615,290 B2 | 11/2009 | Matsuda |
| 2001/0019782 A1 | 9/2001 | Igarashi et al. |
| 2001/0028218 A1 | 10/2001 | Mashiko et al. |
| 2001/0031543 A1 | 10/2001 | Ando et al. |
| 2002/0003403 A1 | 1/2002 | Ghosh et al. |
| 2002/0013013 A1 | 1/2002 | Victor et al. |
| 2002/0015818 A1 | 2/2002 | Takahashi et al. |
| 2002/0020916 A1 | 2/2002 | Ito |
| 2002/0041845 A1 | 4/2002 | Oku et al. |
| 2002/0042240 A1 | 4/2002 | Fujimura et al. |
| 2002/0050785 A1 | 5/2002 | Nakada et al. |
| 2002/0053401 A1 | 5/2002 | Ishikawa et al. |
| 2002/0108940 A1 | 8/2002 | Hembree et al. |
| 2002/0167262 A1 | 11/2002 | Porter et al. |
| 2002/0180371 A1 | 12/2002 | Yamazaki et al. |
| 2002/0190661 A1 | 12/2002 | Duggal et al. |
| 2003/0015687 A1 | 1/2003 | Dick et al. |
| 2003/0025115 A1 | 2/2003 | Uemura et al. |
| 2003/0037677 A1 | 2/2003 | Boroson et al. |
| 2003/0062518 A1 | 4/2003 | Auch et al. |
| 2003/0064888 A1 | 4/2003 | Dick |
| 2003/0066311 A1 | 4/2003 | Li et al. |
| 2003/0127973 A1 | 7/2003 | Weaver et al. |
| 2003/0143423 A1 | 7/2003 | McCormick et al. |
| 2003/0145944 A1 | 8/2003 | Lee et al. |
| 2003/0178937 A1 | 9/2003 | Mishima |
| 2003/0184219 A1 | 10/2003 | Duggal et al. |
| 2003/0205845 A1 | 11/2003 | Pichler et al. |
| 2003/0207500 A1 | 11/2003 | Pichler et al. |
| 2004/0021425 A1 | 2/2004 | Foust et al. |
| 2004/0027062 A1 | 2/2004 | Shiang |
| 2004/0080261 A1 | 4/2004 | Yokota et al. |
| 2004/0099305 A1* | 5/2004 | Heller ............ 136/263 |
| 2004/0104674 A1 | 6/2004 | Yoo et al. |
| 2004/0124760 A1 | 7/2004 | Pothoven et al. |
| 2004/0132315 A1 | 7/2004 | Chambers et al. |
| 2004/0159835 A1* | 8/2004 | Krieger et al. .......... 257/40 |
| 2004/0191963 A1 | 9/2004 | Pichler |
| 2004/0238846 A1 | 12/2004 | Wittmann et al. |
| 2004/0244673 A1 | 12/2004 | Yates et al. |
| 2004/0248337 A1 | 12/2004 | Yan et al. |
| 2005/0023974 A1 | 2/2005 | Chwang et al. |
| 2005/0120956 A1 | 6/2005 | Suzuki |
| 2005/0155435 A1 | 7/2005 | Ziebart et al. |

FOREIGN PATENT DOCUMENTS

| | | |
|---|---|---|
| DE | 3008290 B1 | 2/1981 |
| DE | 19603746 A1 | 4/1997 |
| DE | 10065946 A1 | 6/2002 |
| EP | 374050 A1 | 2/1995 |
| EP | 910228 A1 | 4/1999 |
| EP | 1021070 A1 | 7/2000 |
| EP | 1079666 A2 | 2/2001 |
| EP | 1100107 A2 | 5/2001 |
| EP | 1191612 A2 | 3/2002 |
| EP | 1191614 A2 | 3/2002 |
| EP | 1246272 A2 | 10/2002 |
| JP | 51017668 A | 2/1976 |
| JP | 59079553 A | 5/1984 |
| JP | 61072620 A | 4/1986 |
| JP | 61072621 A | 4/1986 |
| JP | 61136247 A | 6/1986 |
| JP | 62500830 A | 4/1987 |
| JP | 62099456 A | 5/1987 |
| JP | 01501032 A | 4/1989 |
| JP | 08213678 A | 8/1996 |
| JP | 08236660 A | 9/1996 |
| JP | 09210290 A | 8/1997 |
| JP | 10074583 A | 3/1998 |
| JP | 2000040585 A | 2/2000 |
| JP | 2000311588 A | 11/2000 |
| JP | 2001155854 A | 6/2001 |

| | | | |
|---|---|---|---|
| JP | 2001300300 A | 10/2001 |
| JP | 2002203675 A | 7/2002 |
| JP | 2002231439 A | 8/2002 |
| JP | 2003142015 A | 5/2003 |
| JP | 2003517420 A | 5/2003 |
| JP | 2004227792 A | 8/2004 |
| JP | 2005505141 A | 2/2005 |
| KR | 1020030025868 A | 3/2003 |
| TW | 506092 B | 10/2002 |
| TW | 560220 B | 11/2003 |
| WO | 0070655 A2 | 11/2000 |
| WO | 0141512 A1 | 6/2001 |
| WO | 0202714 A2 | 1/2002 |
| WO | 0215645 A1 | 2/2002 |
| WO | 0243098 A1 | 5/2002 |
| WO | 03005774 A1 | 1/2003 |
| WO | 2005050736 A1 | 6/2005 |

OTHER PUBLICATIONS

Gustafsson et al., "Flexible Light-Emitting Diodes Made from Soluble Conducting Polymers," Nature, 1992, vol. 357, pp. 477-479.

O'Brien, D.F. et al., "Electrophosphorescence From a Doped Polymer Light Emitting Diode," Synthetic Metals, 2001, 116(1-3), 379-383.

Tummala et al., Microelectronics Packaging Handbook, 1989, Van Nostrand Reinhold, New York; pp. 736-737, 1146.

Wang—Photoconductive Materials, Kirk-Othmer Encyclopedia of Chemical Technology, Fourth Edition, 1996, vol. 18 pp. 837-860.

Yasuda, "Units of Gas Permeability Constants," Journal of Applied Polymer Science, 1975, vol. 19, pp. 2529-2536.

European Patent Office: Decision to Refuse Patent for Application No. 04800977.3; Mar. 19, 2012.

Official Letter from the EPO; Application No. 04800977.3; Feb. 7, 2011.

PCT International Search Report for Application No. PCT/US2004/037596, counterpart to U.S. Appl. No. 10/984,451; C. Pusch, Authorized Officer; EPO; Apr. 5, 2005.

PCT International Search Report for Application No. PCT/US2004/037597; Joao Cortes Rosa, Authorized Officer; EPO; Jun. 6, 2005.

PCT International Search Report for Application No. PCT/US2005/046323, counterpart to U.S. Appl. No. 11/721,739; Karabi Guharay, Authorized Officer; ISA/US; Feb. 15, 2007.

PCT International Search Report for Application No. PCT/US2005/047412, counterpart to U.S. Appl. No. 11/721,732; Robert B. Davis, Authorized Officer; ISA/US; Nov. 2007.

Summons to Attend Oral Proceedings; EPO; Application No. 04800977.3; Oct. 19, 2011.

* cited by examiner

ELECTRONIC DEVICE INCLUDING AN ORGANIC ACTIVE LAYER AND PROCESS FOR FORMING THE ELECTRONIC DEVICE

CROSS REFERENCE TO RELATED APPLICATIONS

This application claims priority under 35 U.S.C. §120 from U.S. patent application Ser. No. 11/642,158, filed Dec. 20, 2006 now U.S. Pat. No. 8,173,995 (incorporated by reference herein in its entirety), which in turn claimed priority under 35 U.S.C. §119(e) from U.S. Provisional Application No. 60/753,516, "Electronic Device Including an Organic Active Layer and Process for Forming the Electronic Device", Ramakrishan, et al, filed Dec. 23, 2005, which is incorporated by reference herein in its entirety.

BACKGROUND INFORMATION

1. Field of the Disclosure

The invention relates generally to electronic devices and, more specifically, to electronic devices including organic active materials and processes for forming the same.

2. Description of the Related Art

Electronic devices, including organic electronic devices, continue to be more extensively used in everyday life. Examples of an organic electronic device can include an Organic Light-Emitting Diode ("OLED"). A low work function material can be used as a part of an electrode of the OLED. An example of a low work function material can be a Group 1 or Group 2 metal, or any combination thereof. Such a material can react with moisture if not properly sealed. Such a reaction can render the electronic device unusable.

One approach to fabricating an electrode with a low work function can be to form the electrode with two layers. A first layer of the electrode containing the low work function material can be closer to an organic active layer of the device, and a second layer of the electrode acts as a conductor and helps prevent the first layer from contacting moisture.

Radiation at a targeted wavelength or in a targeted spectrum may need to pass through the electrode in a particular application. However, if radiation at a targeted wavelength or in a targeted spectrum is to pass through the electrode using the two-layer approach, the second layer of the electrode may not have a sufficient thickness to prevent moisture from reaching the first layer of the electrode. A defect extending at least partly through the second layer may cause premature failure of the electronic device.

SUMMARY

An electronic device can include an organic active layer and an electrode. In one aspect, the electrode can further include a first layer that is conductive, and a second layer that is conductive. The second layer can include a defect extending at least partly through a thickness of the second conductive layer. The electrode can also include a third layer lying within and substantially filling the defect, wherein each of the second and third layers includes a same metallic element.

In another aspect, a process for forming an electronic device can include forming an organic active layer and forming a first layer that is conductive and is part of an electrode. The process can also include forming a second layer and exposing the second layer to a first plasma to form a first compound from the second layer. In one embodiment, substantially all of the second layer can be consumed when forming the first compound.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
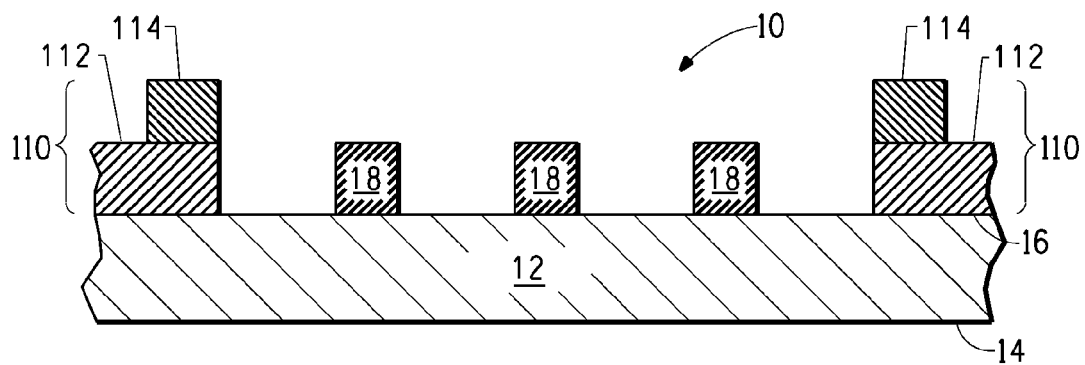
FIG. 1 includes an illustration of a workpiece with first electrodes and conductive members overlying a substrate.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

In a first aspect, an electronic device can include an organic active layer, and an electrode. The electrode can further include a first layer that is conductive, and a second layer that is conductive. The second layer can include a defect extending at least partly through a thickness of the second conductive layer, and the electrode can also include a third layer lying within and substantially filling the defect, wherein each of the second and third layers include a same metallic element.

In an embodiment of the first aspect, the electronic device can further include another electrode wherein the organic active layer lies between the electrodes. In another embodiment, the first conductive layer includes a Group 1 metal, a Group 2 metal, or any combination thereof. In still another embodiment, the second conductive layer includes aluminum, silver, copper, chromium or any combination thereof.

In yet another embodiment, the third layer includes a nitrogen-containing, oxygen-containing, fluorine-containing or any combination thereof material. In another embodiment of the first aspect, the electrode can further include a fourth layer overlying the third layer, the fourth layer including a metal-oxide compound, a metal-nitride compound, a metal-fluoride compound or any combination thereof.

In a second aspect, a process for forming an electronic device can include forming an organic active layer, and forming an electrode further including a first layer and a second layer. Each of the first and second layers is conductive, the second layer is a last layer formed when forming the electrode, and the second layer includes a defect extending at least partly through a thickness of the second layer. The process can further include exposing the second layer to a plasma to form a compound in the defect, wherein the compound is formed from a portion of the second layer.

In an embodiment of the second aspect, forming the organic active layer includes continuously printing the organic active layer. In another embodiment forming the electrode further includes forming each of the first and second layers of the electrode using a physical vapor deposition process. In still another embodiment, forming the electrode further includes forming each of the first and second layers of the electrode using a same stencil mask.

In a particular embodiment of the second aspect, the plasma includes oxygen, nitrogen, fluorine, argon, helium, another noble gas, or any combination thereof. In a more particular embodiment, the plasma of the plasma treatment process is formed in a nitrogen-containing, oxygen-containing, fluorine-containing or any combination thereof ambient.

In a third aspect, a process for forming an electronic device can include forming an organic active layer, and forming a first layer that is conductive and is part of an electrode. The process can further include forming a second layer, and exposing the second layer to a first plasma to form a first compound from the second layer, wherein substantially all of the second layer is consumed when forming the first compound.

In an embodiment of the third aspect, the first plasma includes nitrogen, oxygen, fluorine, argon, helium, another noble gas, or any combination thereof. In another embodiment, each of the first and second layers includes a metal-containing material.

In a particular embodiment of the third aspect, the process can further include forming a third layer after forming the first layer and before forming the second layer, wherein the third layer is conductive and is part of the electrode. In a more particular embodiment, the process can further include forming a fourth layer after exposing the second layer to the first plasma. In an even more particular embodiment, the fourth layer includes a metal-containing layer. In a still more particular embodiment the process can further include exposing the fourth layer to a second plasma to form a second compound from the fourth layer, wherein substantially all of the fourth layer is consumed when forming the second compound.

In an embodiment of the third aspect, forming the second layer includes depositing a material including aluminum, tantalum, niobium, titanium, zirconium, hafnium, nickel, cobalt, chromium, molybdenum, tungsten, lanthanum, cerium, another rare earth metal, indium, tin, zinc, an alloy of titanium and zirconium, indium and tin, indium and zinc, aluminum and zinc or any combination thereof.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by Partial Formation of the Device, Including Formation of the Organic Active Layer, Formation of the Second Electrode, Formation of Encapsulation, Alternate Embodiments, Benefits, and finally Examples.

1. Definitions And Clarification of Terms

Before addressing details of embodiments described below, some terms are defined or clarified.

The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "conductive," when referring to a layer, material, member, or structure is intended to mean such a layer, material, member, or structure through which a significant number of charge carriers (e.g., electrons, holes, or a combination thereof) may pass when operating an electronic device, including such layer, material, member, or structure, over a range of normal operating voltages (e.g., a designed voltage range for use by an end user of the electronic device). In one embodiment, a conductive material has a bulk resistivity no greater than approximately $10^{+2}$ ohm-cm.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "defect" is intended to mean an unintended artifact in a layer, member, or structure, wherein such artifact is formed before an electronic device, including such layer, member, or structure, is substantially completed. In one embodiment, the defect may extend a distance into a layer, member, or structure, wherein the distance is significantly larger than the root mean square roughness of a surface of such layer, member, or structure from which such defect extends. A pinhole extending through at least most of a layer is an example of a defect. An opening formed within a layer, member, or structure by use of a stencil mask or other lithographic process is not a defect.

The term "electrode" is intended to mean a member, a structure, or a combination thereof configured to transport carriers within an electronic component. For example, an electrode may be an anode, a cathode, a capacitor electrode, a gate electrode, etc. An electrode may include a part of a transistor, a capacitor, a resistor, an inductor, a diode, an electronic component, a power supply, or any combination thereof.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors electrically connected to different electronic components where a capacitor between the conductors is unintended or incidental).

The term "electronic device" is intended to mean a collection of circuits, electronic components, or combinations thereof that collectively, when properly electrically connected and supplied with the appropriate potential(s), performs a function. An electronic device may include or be part of a system. An example of an electronic device includes a display, a sensor array, a computer system, an avionics system, an automobile, a cellular phone, other consumer or industrial electronic product, or any combination thereof.

The term "elevation" is intended to mean a distance from a primary surface of a substrate as measured in a direction perpendicular to the primary surface.

The term "metallic" is intended to mean containing one or more metals. For example, a metallic coating can include an elemental metal by itself, a clad, an alloy, a plurality of layers of any combination of elemental metal(s), clad(s), alloy(s), or any combination thereof.

The term "organic active layer" is intended to mean one or more organic layers, wherein at least one of the organic layers, by itself, or when in contact with a dissimilar material is capable of forming a rectifying junction.

The term "organic layer" is intended to mean one or more layers, wherein at least one of the layers comprises a material including carbon and at least one other element, such as hydrogen, oxygen, nitrogen, fluorine, etc.

The term "physical vapor deposition" is intended to mean a process by which material is condensed from a vapor state to form a solid film on a substrate. Evaporation and sputtering are both examples of physical vapor deposition processes.

The term "plasma" is intended to mean an at least partially ionized gas formed by an electrical field. The plasma may include negatively charged species, positively charged species, neutral species, or any combination thereof.

The term "primary surface" is intended to mean a surface of a substrate from which an electronic component is subsequently formed.

The term "radiation-emitting component" is intended to mean an electronic component, which when properly biased, emits radiation at a targeted wavelength or spectrum of wavelengths. The radiation may be within the visible-light spectrum or outside the visible-light spectrum (UV or IR). A light-emitting diode is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The term "stencil mask" is intended to mean an object including a pattern having one or more openings that allows a corresponding pattern to be formed over or within a substrate. A shadow mask is a specific type of stencil mask that can be used to deposit one or more materials over a substrate substantially only at one or more areas corresponding to one of more openings within such mask. A lithographic mask is another specific type of stencil mask that can be used to pattern a resist layer. The lithographic mask includes a pattern of opaque features or other radiation attenuators and may or may not have a mask substrate (e.g., a quartz plate) substantially transparent to radiation used when patterning with the lithographic mask.

The term "substrate" is intended to mean a workpiece that can be either rigid or flexible and may include one or more layers of one or more materials, which can include, but are not limited to, glass, polymer, metal or ceramic materials or combinations thereof.

The term "visible light spectrum" is intended to mean a radiation spectrum having wavelengths corresponding to 400 to 700 nm.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Partial Formation of the Device, Including Formation of the Organic Active Layer FIG. 1 includes an illustration of a cross-sectional view of a portion of a workpiece 10 including first electrodes 18 and a substrate 12. The substrate 12 can be either rigid or flexible and may include one or more layers of one or more materials, which can include, but are not limited to, glass, polymer, metal or ceramic materials or combinations thereof. In one embodiment, the substrate 12 is substantially transparent to a targeted wavelength or spectrum of wavelengths associated with the electronic device. For example, the electronic device may emit radiation within the visible light spectrum, and thus, the substrate 12 would be transparent to radiation within the visible light spectrum. In another example, the electronic device may respond to infrared radiation, and thus the substrate 12 would be transparent to the infrared radiation. The substrate 12 can have a thickness in a range of approximately 12 to 2500 microns.

The substrate 12 includes a user surface 14 and a primary surface 16. The user surface 14 can be the surface of the substrate 12 seen by a user when using the electronic device. The primary surface 16 can be a surface from which at least some of electronic components for the electronic device may be fabricated. Although not illustrated, control circuits may lie within substrate 12, wherein each control circuit would be electrically connected to a corresponding first electrode 18.

A conductive layer can be formed over the substrate 12 and portions can be removed by a conventional or proprietary technique to form the first electrodes 18 and conductive portions 112 of conductive members 110. In one embodiment, the first electrodes 18 can act as anodes for electronic components and include one or more layers used as anodes within LCD or OLED displays. The first electrodes 18 can be formed by a deposition using a conventional or proprietary technique. The first electrodes 18 may have a thickness in a range of approximately 10 to 1000 nm.

The conductive members 110 can act as part of a ground connection for electronic components of the electronic device. In one embodiment, the conductive members 110 are substantially complete after forming the conductive portions 112. In the illustrated embodiment, conventional or proprietary deposition and optional, separate patterning techniques can be used to form conductive portions 114 overlying conductive portions 112 to substantially complete the conductive members 110. The conductive portions 114 can have a thickness in a range of approximately 10 to 1000 nm and can comprise a conductive material such as a metal, a metal alloy, a conductive metal oxide, a conductive metal nitride, a conductive metal oxynitride, a conductive organic material, or one or more other suitable materials, or any combination thereof, as described herein. The conductive portions 112 and 114 may include the same or different materials. In a particular embodiment, conductive portion 114 can comprise a stack of Cr/Al/Cr layers and have a total thickness in a range of 500 to 600 nm.

Figure 2:
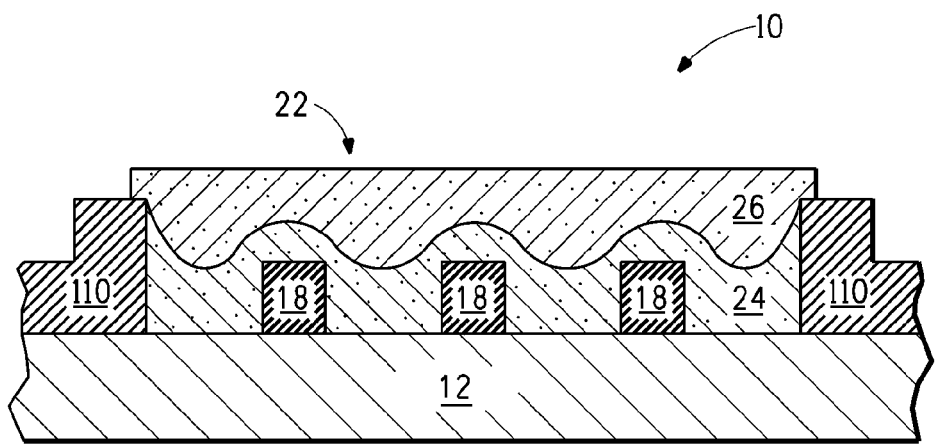
FIG. 2 includes an illustration of the workpiece of FIG. 1 after forming an organic layer.

An organic layer 22 is formed over the first electrodes 18 and the substrate 12, as illustrated in FIG. 2. The organic layer 22 may include one or more layers. For example, the organic layer can include an organic active layer, a buffer layer, an electron-injection layer, an electron-transport layer, an electron-blocking layer, a hole-injection layer, a hole-transport layer, or a hole-blocking layer, or any combination thereof. In one embodiment, the organic layer 22 may include a first organic layer 24 and an organic active layer 26.

Any individual or combination of layers within the organic layer 22 can be formed by a conventional or proprietary technique, including spin coating, vapor depositing (chemical or physical), printing (ink jet printing, screen printing, solution dispensing (dispensing the liquid composition in strips or other predetermined geometric shapes or patterns, as seen from a plan view), another continuous printing process or any combination thereof), other depositing techniques, or any combination thereof for appropriate materials as described below. Any individual or combination of layers within the organic layer 22 may be cured after deposition.

As illustrated in FIG. 2, the first organic layer 24 may act as a buffer layer, an electron-blocking layer, a hole-injection layer, a hole-transport layer, or any combination thereof. In one embodiment, the first organic layer includes a single layer, and in another embodiment, the first organic layer 24 can include a plurality of layers. The first organic layer 24 may include one or more materials that may be selected depending on the function that the first organic layer 24 is to provide. In one embodiment, if the first organic layer 24 is to act as a buffer layer, the first organic layer 24 may include a conventional or proprietary material that is suitable for use in a buffer layer, as used in an OLED display. In another embodiment, if the first organic layer 24 is to act as a hole-transport layer, the first organic layer may include a conventional or proprietary material that is suitable for use in a hole-transport layer. In one embodiment, the thickness of the first organic layer 24 may have a thickness in a range of approximately 50 to 300 nm, as measured over the substrate 12 at a location spaced apart from the first electrodes 18. In another embodiment, the first organic layer 24 may be thinner or thicker than the range recited above.

The composition of the organic active layer 26 can depend upon the application of the electronic device. In one embodiment, the organic active layer 26 is used in a radiation-emitting component. In a particular embodiment, the organic active layer 26 can include a blue light-emitting material, a green light-emitting material, or a red light-emitting material. Other organic active layers (not illustrated) for radiation at different targeted wavelengths or spectra of wavelengths, as compared to the organic active layer 26, can be formed. Although not illustrated, a structure (e.g., a well structure, cathode separators, or the like) may lie adjacent the first electrodes 18 to reduce the likelihood of materials from different organic active layers from contacting each other at locations above the first electrodes 18. For a monochromatic display, the organic active layers may have substantially the same composition. In another embodiment, an organic active layer that is substantially continuous over the portion of the substrate 12 illustrated in FIG. 2 can replace the organic active layer 26. In another embodiment, the organic active layer 26 may be used in a radiation-responsive component, such as a radiation sensor, photovoltaic cell, or the like.

The organic active layer 26 and potentially other organic active layers can include material(s) conventionally used as organic active layers in organic electronic devices and can include one or more small molecule materials, one or more polymer materials, or any combination thereof. After reading this specification, skilled artisans will be capable of selecting appropriate material(s), layer(s) or both for the organic active layer 26 or potentially other organic active layers. In one embodiment, the organic active layers 26 or another potential organic active layer has a thickness in a range of approximately 40 to 100 nm, and in a more specific embodiment, in a range of approximately 70 to 90 nm. In one embodiment, organic active layer 26 can be formed by a continuous printing process.

In an alternative embodiment, the organic layer 22 may include a single layer with a composition that varies with thickness. For example, the composition nearest the first electrodes 18 may act as a hole transporter, the next composition may act as an organic active layer, and the composition furthest from the first electrodes 18 may act as an electron transporter. Similarly, the function of charge injection, charge blocking, or any combination of charge injection, charge transport, and charge blocking can be incorporated into the organic layer 22. One or more materials may be present throughout all or only part of the thickness of the organic layer.

Although not illustrated, a hole-blocking layer, an electron injection layer, an electron-transport layer, or any combination thereof may be part of the organic layer 22 and formed over the organic active layer 26. The electron-transport layer can allow electrons to be injected from the subsequently formed second electrode (i.e., cathode) and transferred to the organic active layer 26. The hole-blocking layer, electron injection layer, electron-transport layer, or any combination thereof typically has a thickness in a range of approximately 30 to 500 nm.

Any one or more of the layers within the organic layer 22 may be patterned using a conventional or proprietary technique to remove portions of the organic layer 22 where electrical contacts (not illustrated) are subsequently made. Typically, the electrical contact areas are near the edge of the array or outside the array to allow peripheral circuitry to send or receive signals to or from the array.

3. Formation of the Second Electrode

Figure 3:
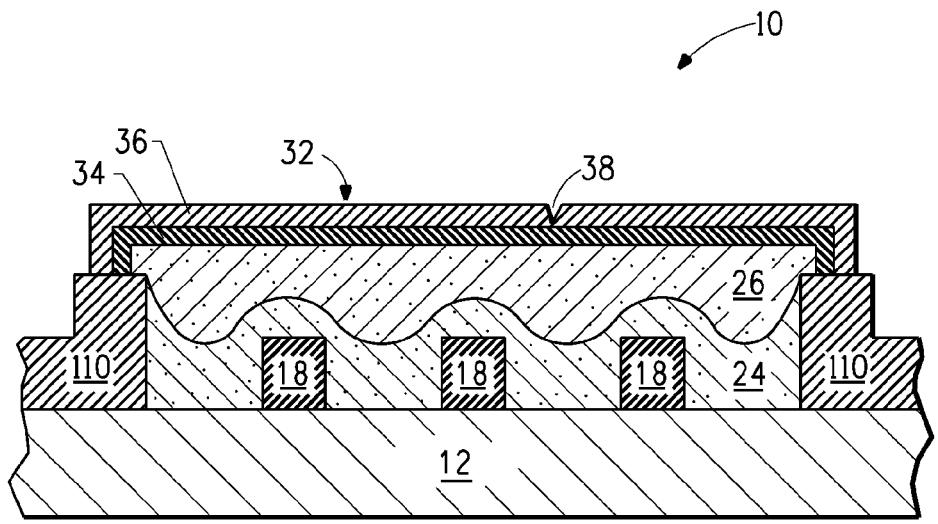
FIG. 3 includes an illustration of the workpiece of FIG. 2 after forming a first conducting layer and a second conducting layer of an electrode, wherein the second layer has a defect.

A second electrode 32 is formed over the organic layer 22, such that the organic active layer 26 lies between the first electrodes 18 and the second electrode 32, as illustrated in FIG. 3. The second electrode 32 can act as a cathode for the electronic component being formed. In one embodiment, the electronic component is a radiation-emitting component, a radiation-responsive component, or the like. In a further embodiment (not illustrated), a path to a different user surface of the electronic device can pass through the second electrode and may limit the possible thickness range for the second electrode 32.

The second electrode 32 can include one or more layers or other portions. A layer or portion of the second electrode 32 closest to the organic active layer 26 can set the work function for the second electrode 32. In one embodiment, another layer or portion of the second electrode 32 can be used to help isolate the work function setting portion from one or more contaminants, such as moisture, while allowing current to flow at relatively low resistance. In a particular embodiment as illustrated in FIG. 3, the second electrode 32 includes a first conductive layer 34 and a second conductive layer 36. As illustrated, the second conductive layer 36 includes a defect 38.

The first conductive layer 34 can include a low work function material. The first conductive layer 34 can include a Group 1 metal (e.g., Li, Cs, etc.), a Group 2 (alkaline earth) metal, a rare earth metal, including the lanthanides and the actinides, an alloy including any of the foregoing metals, a salt of any of the foregoing, or any combination thereof. A conductive polymer with a low work function may also be used. The thickness of the first conductive layer 34 can be in a range of approximately 0.5 to 5 nm. In one embodiment, the thickness of the first conductive layer 34 is chosen such that the first conductive layer 34 is substantially transparent to radiation at the targeted wavelength or spectrum of wavelengths. In another embodiment, the first conductive layer 34 can have a thickness outside of the range (thinner or thicker).

The second conductive layer 36 may include nearly any conductive material, including those previously described with respect to the first electrodes 18. The second conductive layer 36 is used primarily for its ability to allow current to flow while keeping resistance relatively low but can also help reduce the interaction of material from the first conductive layer 34 with the atmosphere. Second conductive layer 36 can comprise the last layer of second electrode 32. At least a potion of layer 36 can contain a metal element. An exemplary material for second conductive layer 36 includes aluminum, silver, copper, or any combination thereof. In many applications, the thickness of the second conductive layer 36 may be in a range of approximately 5 to 500 nm. If radiation is not to be transmitted through the second electrode 32, the upper limit on the thickness of the second conductive layer 36 may be greater than 500 nm.

In one embodiment, the second electrode 32 is formed by placing a stencil mask over the substrate 12 and using a conventional or proprietary physical vapor deposition technique to deposit first conductive layer 34 and second conductive layer 36 of second electrode 32, as illustrated in FIG. 3. In another embodiment, the second electrode 32 is formed by blanket depositing any individual or combination of the layers 34 and 36 for the second electrode 32. A masking layer (not illustrated) is then formed over portions of the layer(s) that are to remain to form second electrode 32. A conventional or proprietary etching technique is used to remove exposed portions of the layer(s) and leave the second electrode 32. After the etching, the masking layer is removed using a conventional or proprietary technique.

During or subsequent to forming the second conductive layer 36, a defect 38 can be formed, wherein the second conductive layer 36 is locally thinner at the defect 38 than a nominal thickness of the second conductive layer 36. A defect 38 can be more likely to affect the electronic device when the second conductive layer 36 is nominally less than 500 nm in thickness than when second conductive layer 36 is nominally 500 nm or greater in thickness, such as when radiation is to be transmitted through the second electrode 32. In one embodiment, the defect 38 can extend at least partly into the second conductive layer 36. In another embodiment, the defect 38 can extend most of the way through a thickness of the second conductive layer 36. In still another embodiment, the defect 38 may extend completely through the second conductive layer 36, and thus allow the first conductive layer 34 to become exposed.

The ability of moisture or other contaminants to reach the first conductive layer 34 can vary across second conductive layer 36. For example, it may be less difficult for moisture or contaminants to reach conductive layer 34 at defect 38 than at a location of nominal thickness. Moisture or contaminants reaching conductive layer 34 at a location can contribute to earlier failure of an electronic component that contains the location.

4. Formation of Encapsulation

Figure 4:
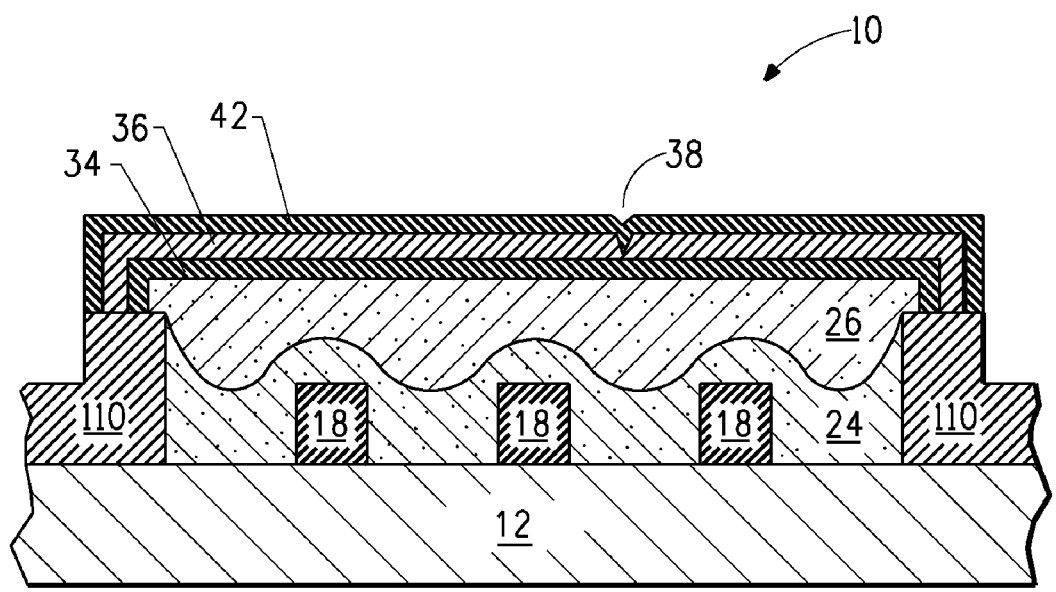
FIG. 4 includes an illustration of the workpiece of FIG. 3 after forming of a third layer.
Figure 5:
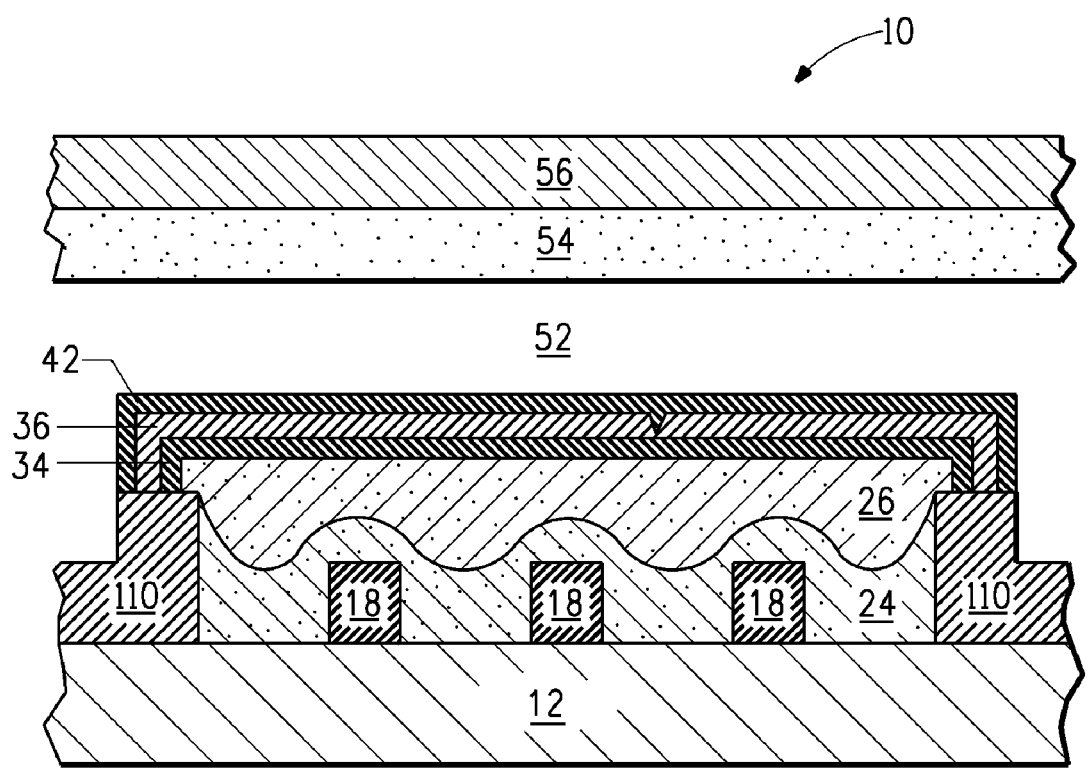
FIG. 5 includes an illustration of a substantially completed electronic device.

A third layer 42 can be formed by exposing a portion of the second conductive layer 36 to a plasma, as illustrated in FIG. 4. The third layer 42 can comprise a metal oxide, a metal nitride, a metal fluoride, or any combination thereof, formed within the defect 38. The portion of the third layer 42 within the defect 38 can make it more difficult for moisture or other contaminants to reach the first conductive layer 34 than it would be without the third layer 42 present. Thus, formation of the third layer 42 within defect 38 can help extend the time to failure for a portion near defect 38. In one embodiment, the third layer 42 can lie within and at least partially fill the defect 38. In another embodiment, the third layer 42 can overlie other portions of the second conductive layer 36 in addition to lying within the defect 38. In another embodiment, the third layer 42 can substantially fill the defect 38.

The second conductive layer 36 can be exposed to a plasma treatment process including a first plasma. During the exposure to the first plasma, a portion of the second conductive layer 36 can react to form the third layer 42. The third layer 42 can be a first encapsulating layer and can include a compound formed from the exposed portion of the second conductive layer 36. In a particular embodiment, workpiece 10 can be placed in an oxygen-containing ambient, nitrogen-containing ambient, fluorine-containing ambient or any combination thereof. The first plasma can be formed that includes oxygen, nitrogen, fluorine, or any combination thereof. A surface portion of the second conductive layer 36 can react with the first plasma to form an oxygen-containing material, nitrogen-containing material, fluorine-containing material, or any combination thereof. In one embodiment, a metal-containing portion of second conductive layer 36 can form a metallic oxide portion, a metallic nitride portion, a metallic fluoride portion or any combination thereof of the third layer 42. The third layer 42 may be a conductor or an insulator.

Other circuitry not illustrated, may be formed using any number of the previously described or additional layers. Although not illustrated, additional insulating layer(s) and interconnect level(s) may be formed to allow for circuitry in peripheral areas (not illustrated) that may lie outside the array. Such circuitry may include row or column decoders, strobes (e.g., row array strobe, column array strobe, or the like), sense amplifiers, or any combination thereof.

A lid 56 with a desiccant 54 is attached to the substrate 12 at locations (not illustrated) outside the array to form a substantially completed electronic device. A gap 52 may or may not lie between electrode 32 and the desiccant 54. The materials used for the lid and desiccant and the attaching process are conventional or proprietary. The lid 56 typically lies on a side of the electronic device opposite the user side of the electronic device. Still, if desired, radiation may be transmitted through the lid 56 instead of or in conjunction with the substrate 12. If so, the lid 56 and desiccant 54 can be designed to allow sufficient radiation to pass through. In another embodiment, the third layer 42 provides sufficiently robust encapsulation to allow desiccant 54 to be omitted.

5. Alternate Embodiments

Figure 6:
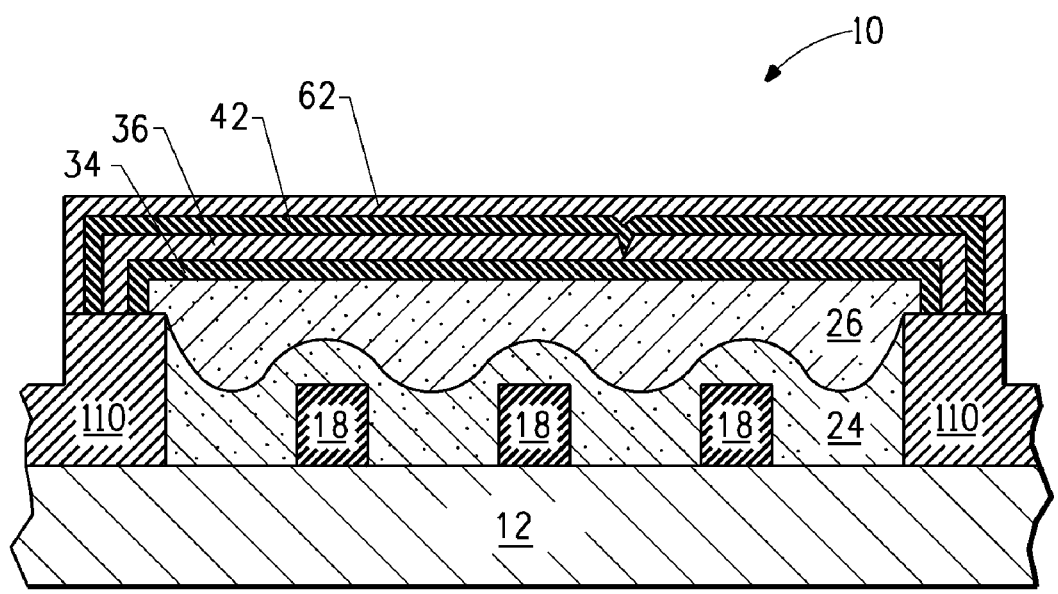
FIG. 6 includes an illustration of the workpiece of FIG. 4 after forming an additional conducting layer in accordance with an alternate embodiment.

In an alternate embodiment, where a thicker encapsulation layer is needed or desired, an additional conductive layer 62 can be deposited overlying the third layer 42 as illustrated in FIG. 6. Additional conductive layer 62 can be formed by any embodiment described for second conductive layer 32. The thickness of additional conductive layer 62 can be selected such that during exposure to a second plasma substantially all of additional conductive layer 62 can be consumed to form a compound. In one embodiment, additional conductive layer 62 is not greater than 60 nm in thickness.

Figure 7:
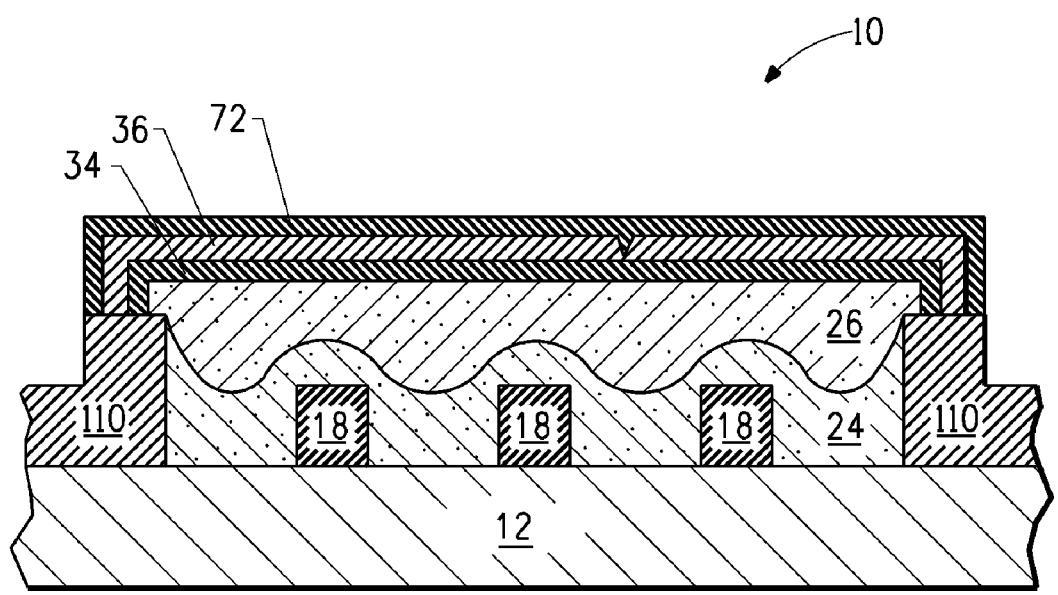
FIG. 7 includes an illustration of the workpiece of FIG. 6 after substantially all of the additional conducting layer forms a compound.

Additional conductive layer 62 can then be exposed to the second plasma as illustrated in FIG. 7. The second plasma can be formed in conditions similar to the first plasma. Substantially all of additional conductive layer 62 can be converted to a compound effectively thickening the encapsulation layer 42 to form an encapsulating layer 72. By depositing other additional conductive layers 62 and exposing each to a plasma treatment, an encapsulation layer 72 of substantially any thickness can be formed. Although not illustrated, an opening can be made in the encapsulating layer 72 to allow electrical or other contact to the electrode 32. In other embodiments, the encapsulating layer 72 can be conductive so such an opening may not be formed.

In other embodiments, the electrodes 18 and 32 can be reversed.

In this embodiment, the electrode 32 would lie closer to the user side of the substrate 12, as compared to electrodes 18. The electrode 32 could include a plurality of second electrodes that are each connected to control circuits (not illustrated). Also, the first electrodes 18 could be replaced by a common first electrode. In still another alternative embodiment, the control circuits may be connected to one type of electrode that lie farther from the substrate 12 as compared to the other type of electrode.

6. Benefits

The defect 38 extending part way or completely through the second conductive layer 36 can shorten the time to failure for an electronic device. Such a defect can be problematic when the second conductive layer 36 is constrained by its designed maximum thickness. For example, radiation at a targeted wavelength or spectrum may need to be, or be designed to be, transmitted through the second electrode 32.

Encapsulating the second electrode 32 after formation of the second conductive layer 36 can reduce the ability of moisture or other contaminants to reach the first conductive layer 34 through the defect 38 in sufficient quantity to impair the function of the electronic device. Improvement in robustness of the second conductive layer 36 can reduce or eliminate the need for a desiccant 54 to be included in the package.

EXAMPLE

The concepts described herein will be further described in the following example, which does not limit the scope of the invention described in the claims. The Example demonstrates integration of an encapsulating layer into a typical PLED or OLED display manufacturing process.

One or more organic layers, including an organic active layer are deposited overlying a substrate including an ITO anode. A cathode can be formed over the organic layer(s) and include a first conductive layer and a second conductive layer. The first conductive layer of Ca, Ba, Li, LiF, or Mg—Ag is deposited by either evaporation or sputtering under vacuum. The thickness of the first conductive layer can be in a range of approximately 2 to 10 nm. The second conductive layer of Al can be deposited by evaporating or sputtering under vacuum. The second conductive layer can have a thickness in a range of 100 nm to 1000 nm. The first and second conductive layers can be deposited using the same shadow mask.

The surface of the second conductive layer is exposed to a first plasma treatment. The plasma is formed in an ambient with oxygen, nitrogen, fluorine, argon, helium, another noble gas, or any combination thereof. A portion of the second conductive layer can react to form an aluminum oxide compound, aluminum nitride compound, aluminum fluoride compound, or any combination thereof.

A first additional conductive layer of Al, Ta, Nb, Ti, Zr, Hf, Ni, Co, Mo, W, La, Ce, other rare earth metals, In, Sn, Zn, an alloy of Ti—Zr, In—Sn, In—Zn, Al—Zn, or any combination thereof can be deposited by evaporation or sputtering under vacuum. The first additional conductive layer can have a thickness in a range of approximately 5 nm to approximately 100 nm. The surface of the first additional conductive layer can be exposed to a second plasma treatment similar to the first plasma treatment such that substantially all of the additional conductive layer can be converted to a metallic oxide compound, metallic nitride compound, metallic fluoride compound or any combination thereof.

In other embodiments, other additional layers can be deposited and converted to compounds using other plasma treatments. Any other additional conductive layer and any other plasma treatment can form other compound layers either the same or different from the first additional conductive layer.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A process for forming an electronic device comprising:
   forming an organic active layer;
   forming an electrode further comprising a first layer and a second layer, wherein:
     each of the first and second layers is conductive;
     the second layer is a last layer formed when forming the electrode; and
     the second layer includes a defect extending at least partly through a thickness of the second layer; and
   exposing the second layer to a plasma to form a compound in the defect, wherein the compound is formed from a portion of the second layer.

2. The process of claim 1, wherein forming the organic active layer comprises continuously printing the organic active layer.

3. The process of claim 1, wherein forming the electrode further comprises forming each of the first and second layers of the electrode using a physical vapor deposition process.

4. The process of claim 1, wherein forming the electrode further comprises forming each of the first and second layers of the electrode using a same stencil mask.

5. The process of claim 1, wherein the plasma includes oxygen, nitrogen, fluorine, argon, helium, another noble gas, or any combination thereof.

6. The process of claim 5, wherein the plasma of the plasma treatment process is formed in a nitrogen-containing, oxygen-containing, fluorine-containing or any combination there of ambient.

7. A process for forming an electronic device comprising:
   forming an organic active layer;
   forming a first layer that is conductive and is part of an electrode;
   forming a second layer; and
   exposing the second layer to a first plasma to form a first compound from the second layer, wherein substantially all of the second layer is consumed when forming the first compound.

8. The process of claim 7, wherein the first plasma includes nitrogen, oxygen, fluorine, argon, helium, another noble gas, or any combination thereof.

9. The process of claim 7, wherein each of the first and second layers comprise a metal-containing material.

10. The process of claim 7 further comprising forming a third layer after forming the first layer and before forming the second layer, wherein the third layer is conductive and is part of the electrode.

11. The process of claim 10, further comprising forming a fourth layer after exposing the second layer to the first plasma.

12. The process of claim 11, wherein the fourth layer includes a metal-containing layer.

13. The process of claim 12, further comprising exposing the fourth layer to a second plasma to form a second compound from the fourth layer, wherein substantially all of the fourth layer is consumed when forming the second compound.

14. The process of claim 7, wherein forming the second layer comprises depositing a material including aluminum, tantalum, niobium, titanium, zirconium, hafnium, nickel, cobalt, chromium, molybdenum, tungsten, lanthanum, cerium, another rare earth metal, indium, tin, zinc, an alloy of titanium and zirconium, indium and tin, indium and zinc, aluminum and zinc or any combination thereof.

* * * * *